(12) United States Patent
Morita et al.

(10) Patent No.: US 11,069,542 B2
(45) Date of Patent: Jul. 20, 2021

(54) CLEANING WATER SUPPLY DEVICE

(71) Applicant: KURITA WATER INDUSTRIES LTD., Tokyo (JP)

(72) Inventors: Hiroshi Morita, Tokyo (JP); Nobuko Gan, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 0 days.

(21) Appl. No.: 16/603,444

(22) PCT Filed: Mar. 20, 2018

(86) PCT No.: PCT/JP2018/011101
§ 371 (c)(1),
(2) Date: Oct. 7, 2019

(87) PCT Pub. No.: WO2018/190090
PCT Pub. Date: Oct. 18, 2018

(65) Prior Publication Data
US 2020/0152488 A1    May 14, 2020

(30) Foreign Application Priority Data

Apr. 14, 2017 (JP) .............................. JP2017-080627

(51) Int. Cl.
*H01L 21/67* (2006.01)
*B08B 3/08* (2006.01)
(Continued)

(52) U.S. Cl.
CPC .......... *H01L 21/67051* (2013.01); *B08B 3/08* (2013.01); *C02F 1/008* (2013.01);
(Continued)

(58) Field of Classification Search
CPC .... C02F 1/008; C02F 1/20; C02F 1/44; C02F 1/66; C02F 1/685; C02F 1/722;
(Continued)

(56) References Cited

U.S. PATENT DOCUMENTS 7,329,312 B2 * 2/2008 Morita .................. B01F 3/0446
261/121.1
2005/0093182 A1    5/2005 Morita et al.

FOREIGN PATENT DOCUMENTS

JP    2000271549 A *  1/2000
JP    2000-288373 A   10/2000
(Continued)

OTHER PUBLICATIONS

PCT/ISA/210, "International Search Report for International Application No. PCT/JP2018/011101," dated Jun. 19, 2018.
(Continued)

*Primary Examiner* — Terry K Cecil
(74) *Attorney, Agent, or Firm* — Manabu Kanesaka

(57) ABSTRACT

A cleaning water supply device includes an ultrapure water line through which ultrapure water flows by a fixed amount, a production unit that produces cleaning water by adding a solute to the ultrapure water line by a fixed amount, a storage tank for the cleaning water, cleaning machines to which the cleaning water is supplied from the storage tank, and a controller that controls the cleaning water production unit so that a water level in the storage tank is in a predetermined range.

10 Claims, 3 Drawing Sheets

(51) Int. Cl.
*C02F 1/00* (2006.01)
*C02F 1/66* (2006.01)
*C02F 1/68* (2006.01)
*C02F 103/34* (2006.01)

(52) U.S. Cl.
CPC ............... *C02F 1/66* (2013.01); *C02F 1/685* (2013.01); *C02F 2103/346* (2013.01); *C02F 2209/04* (2013.01); *C02F 2209/06* (2013.01); *C02F 2209/40* (2013.01); *C02F 2209/42* (2013.01)

(58) Field of Classification Search
CPC ............ C02F 2103/04; C02F 2103/346; C02F 2209/04; C02F 2209/06; C02F 2209/40; C02F 2209/42; B08B 3/08; H01L 21/304; H01L 21/67017; H01L 21/67051
See application file for complete search history.

(56) References Cited

FOREIGN PATENT DOCUMENTS

| | | |
|---|---|---|
| JP | 2000-294532 A | 10/2000 |
| JP | 2003-334433 A | 11/2003 |
| JP | 2016-139766 A | 8/2016 |

OTHER PUBLICATIONS

Japan Patent Office, "Notice of Reasons for Refusal for Japanese Patent Application No. 2017-080627," dated Jun. 6, 2018.

\* cited by examiner

CLEANING WATER SUPPLY DEVICE

TECHNICAL FIELD

The present invention relates to a device that produces cleaning water for a semiconductor wafer and the like by adding a pH adjuster, an oxidation-reduction potential adjuster, and the like to ultrapure water, and supplies the cleaning water, and more particularly to a device suitable for producing and supplying wafer cleaning water containing solutes such as the pH adjuster and the oxidation-reduction potential adjuster at an extremely low concentration.

BACKGROUND ART

In a cleaning/rinse water process for a semiconductor wafer, in order to suppress the electrification, metal corrosion and melting, and fine particle adhesion of the wafer, a water quality adjustment water obtained by dissolving an acidic or alkaline pH adjuster or an oxidation-reduction potential adjuster such as an oxidizing agent or a reducing agent in ultrapure water at a minimum necessary concentration that is extremely low may be used as cleaning water (including rinse water) (for example, see PTL 1). As a method for producing the cleaning water, there is a method of dissolving reducible, oxidized, acid, or alkaline gas such as $H_2$, $O_3$, $CO_2$, and $NH_3$ in the ultrapure water. However, a method of injecting a chemical solution obtained by dissolving the pH adjuster and/or the oxidation-reduction potential adjuster in water is often employed due to the simplicity of the operation. Methods for injecting the chemical solution include a method using a pump, and a method using pressurization by inert gas such as $N_2$ and a closed container, and those methods are put in practical use.

When the flow rate of the ultrapure water is constant, it is easy to add the solute so as to obtain a desired concentration. However, in a cleaning machine in which dilute cleaning water is actually used, the supplying and suspension of the water poured onto the wafer is controlled by the opening and closing of a plurality of valves, and the flow rate fluctuates on an irregular basis.

In order to cause the solute concentration of the dilute cleaning water to fall within a desired range even when the ultrapure water flow fluctuates, solute adding control is performed by various methods such as proportional control with respect to the flow rate of the ultrapure water and PID control performed by receiving signals from a concentration monitor. However, especially in a single-wafer cleaning machine including a plurality of cleaning chambers, solute adding control that can sufficiently follow irregular fluctuation in the flow rate is not achieved. As a result, there have been times when the liquid quality of the cleaning water or the rinse water poured onto the wafer greatly deviates from a target value.

There are simple methods in which the liquid quality stabilization is prioritized and the dilute cleaning water is continuedly produced and supplied under fixed conditions. However, in this case, excess water directly flows out. In recent multi-chamber single-wafer cleaning machines, the difference between the maximum flow rate and the minimum flow rate that are momentarily needed is large. When the cleaning water is continuously supplied by the maximum flow rate or more, a corresponding amount of excess water is discharged, which causes a problem in terms of the load on facilities for service water and drainage water, excess usage and discharge of the chemical solution.

PTL 1: JP 2016-139766 A

SUMMARY OF INVENTION

An object of the present invention is to provide a cleaning water supply device that is capable of stably supplying cleaning water, which contains solutes such as alkali and an oxidizing agent at an extremely low concentration and is suitable to be supplied in a cleaning/rinsing process for a semiconductor wafer and the like, and discharges little or no excess water.

A cleaning water supply device of the present invention includes: a cleaning water production unit that produces cleaning water at a certain concentration by adding a pH adjuster and/or an oxidation-reduction potential adjuster to ultrapure water; a storage tank that stores the cleaning water from the cleaning water production unit therein; and supply means for supplying the cleaning water in the storage tank to a cleaning machine.

In one aspect of the present invention, controlling means for controlling the cleaning water production unit so that a cleaning water level in the storage tank is in a predetermined range is further included.

In one aspect of the present invention, switching means for guiding the cleaning water from the cleaning water production unit to a discharge line when a water quality of the cleaning water from the cleaning water production unit is out of a specified range is further included.

In one aspect of the present invention, the removal unit includes a removal unit that collects water by removing a solute from discharged water from the discharge line.

In one aspect of the present invention, the controlling means causes the ultrapure water to flow to the cleaning water production unit at a low flow rate while the cleaning water production unit is suspended.

In one aspect of the present invention, the controlling means sets two stages for a production flow rate of the cleaning water in the cleaning water production unit, switches the production flow rate from a high flow rate to a low flow rate when the water level in the storage tank becomes equal to or more than a first predetermined water level, and switches the production flow rate from the low flow rate to the high flow rate when the water level becomes equal to or less than a second predetermined water level.

Advantageous Effects of Invention

In the present invention, the cleaning water at a certain concentration is produced in the cleaning water production unit. The cleaning water at a certain concentration is stored in the storage tank and the cleaning water in the storage tank is supplied to the wafer cleaning machine. The cleaning water with a stable water quality in the storage tank is supplied to the cleaning machine.

According to the present invention, in a multi-chamber single-wafer cleaning machine in which a large number of valves open and close on an irregular basis, the supplying in which the extremely important liquid quality is accurately and stably maintained at a desired value can be achieved in the cleaning/rinsing process, and the ultrapure water can be prevented from being wasted by eliminating the discharge of excess water.

DESCRIPTION OF EMBODIMENT

The present invention is described in detail below with reference to the drawings.

Figure 1:
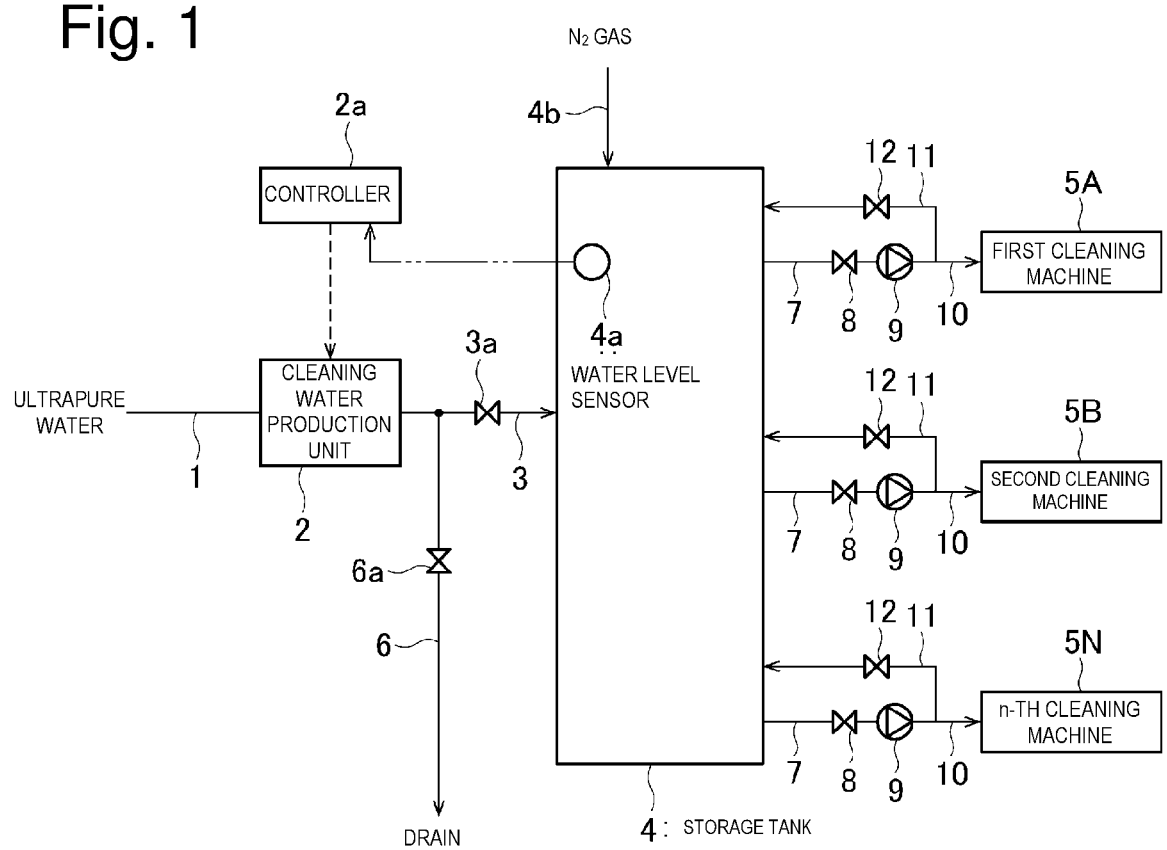
FIG. 1 is a system diagram illustrating an example of an embodiment of a cleaning water supply device of the present invention.

FIG. 1 is a system diagram illustrating an example of an embodiment of a cleaning water supply device of the present invention.

The cleaning water supply device is for producing water quality adjustment water by adding a pH adjuster, an oxidation-reduction potential adjuster, and/or the like to ultrapure water, and supplying the water quality adjustment water to a cleaning machine, and includes a ultrapure water line 1 through which ultrapure water flows by a fixed amount, a production unit 2 that produces cleaning water by adding a solute to the ultrapure water line by a fixed amount, a storage tank 4 into which the produced cleaning water is introduced via piping 3, a number of n first to n-th cleaning machines 5A, 5B, . . . and 5N to which the cleaning water is supplied from the storage tank 4, and the like. A valve 3a is provided in the piping 3. On the upstream side of the valve 3a, drain piping 6 branches off from the piping 3. A valve 6a is provided in the piping 6.

A water level sensor 4a is provided in the storage tank 4, and a detection signal of the water level sensor 4a is input to a controller 2a. The cleaning water production unit 2 and the valves 3a and 6a are controlled by the signals from the controller 2a.

Inert gas supplying piping 4b for nitrogen gas and the like for purging oxygen is connected to the storage tank 4.

The liquid quality of the dilute cleaning water generally produced by adding a chemical solution with the EL grade such as alkali, such as ammonia water, acid, such as hydrochloric acid, and oxidizing agents, such as a hydrogen peroxide solution, is stable. Therefore, the solute concentration of the cleaning water hardly changes even when the cleaning water is made ahead and is stored in the storage tank 4 as long as the time is not extremely long. In this embodiment, oxygen is purged by $N_2$ gas and the like, and hence the oxygen in the atmosphere does not dissolve in the cleaning water.

When the water level in the storage tank 4 is a certain water level or more, the production of the cleaning water in the production unit 2 is suspended. When the water level in the storage tank 4 decreases to a defined lower limit level in accordance with the consumption in the cleaning machines 5A to 5N, the production of the cleaning water in the production unit 2 and the supplying of the cleaning water to the storage tank 4 are started. The production flow rate at this time is set to be larger than the maximum flow rate (total flow rate) used in the cleaning machines 5A to 5N, and the water level is caused to certainly be raised. When the water level reaches a defined upper limit level, the production and the supplying of the cleaning water are suspended. By repeating the above thereafter, the cleaning water is stored in the storage tank 4 so as to constantly be at a water level between the lower limit level and the upper limit level described above.

Note that gravity measurement means for detecting the weight of the storage tank 4 may be used instead of the water level sensor 4a.

The storage tank 4 made of a highly-pure material, which does not deteriorate the purity of the dilute cleaning water and causes the elution from inner walls to be at an ignorable level, is used. In order to prevent the rise of dissolved oxygen, a gas phase portion in the storage tank 4 is preferred to be equipped with a mechanism (for example, the purging inert gas supplying piping 4b) to be constantly filled with inert gas such as $N_2$ at a constant pressure.

When the dissolved oxygen concentration in the ultrapure water (raw water) is high or the dissolved oxygen concentration in the chemical solution (acid, alkali, or oxidizing agent) needs to be reduced, the production unit is preferred to be equipped with a mechanism that reduces dissolved oxygen such as a deaeration membrane as in FIGS. 7 and 8 described below.

The cleaning water is supplied to the cleaning machines 5A, 5B, . . . and 5N from the storage tank 4 via branching piping 7, a valve 8, a pump 9, and piping 10. A filter may be provided in the piping 10. Return piping 11 branches off from the piping 10, and the terminal side of the return piping 11 is connected to the storage tank 4. A valve 12 is provided in the return piping 11.

In the ultrapure water line 1, the ultrapure water flows at a constant flow rate by a fixed amount supply device including a metering pump, a constant flow rate valve, a flow rate control device, and the like. In the production unit 2, the solute is added to the ultrapure water by a constant supply amount. As a result, cleaning water that has reached a target concentration with high accuracy is supplied to the storage tank 4.

An example of the configuration of the cleaning water production unit 2 is illustrated in FIGS. 3 to 8.

Figure 3:
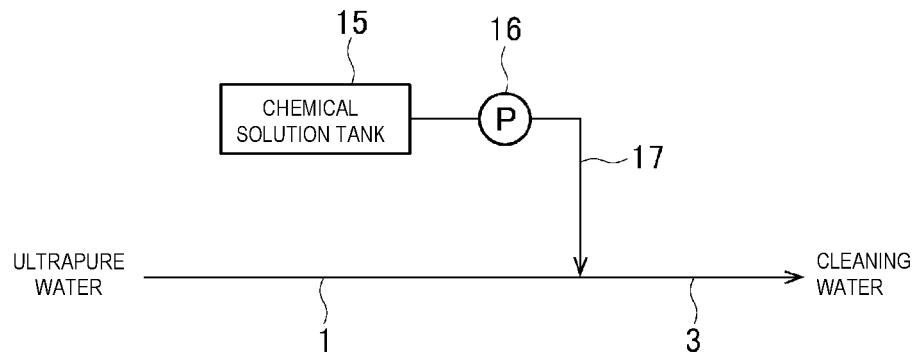
FIG. 3 is a configuration diagram of a cleaning water production unit.

In FIG. 3, the cleaning water production unit is formed by a chemical solution tank 15, a chemical injection pump 16, and a chemical injection piping 17. In the chemical solution tank 15, a chemical solution in which one or more types of a pH adjuster, an oxidation-reduction potential adjuster, and the like are dissolved at a predetermined concentration is stored. As the chemical injection pump 16, a metering pump or a pump with a flow rate control device is used. As in FIG. 4, two or more chemical injection units each formed by the chemical solution tank 15, the chemical injection pump 16, and the chemical injection piping 17 may be installed.

Figure 4:
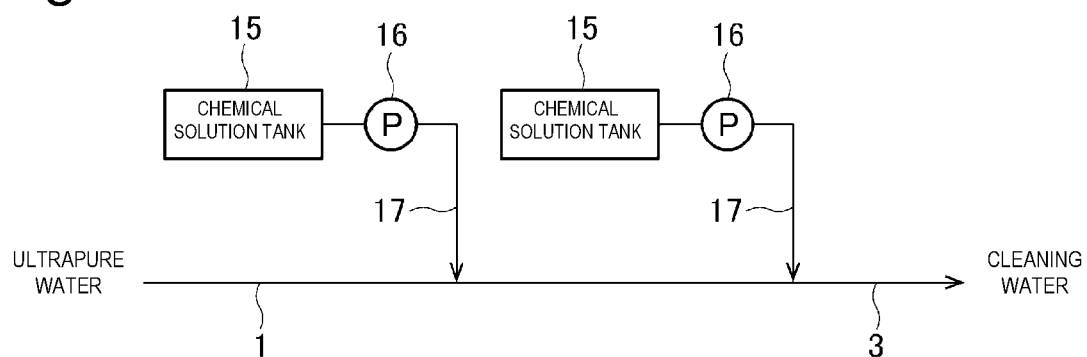
FIG. 4 is a configuration diagram of the cleaning water production unit.
Figure 5:
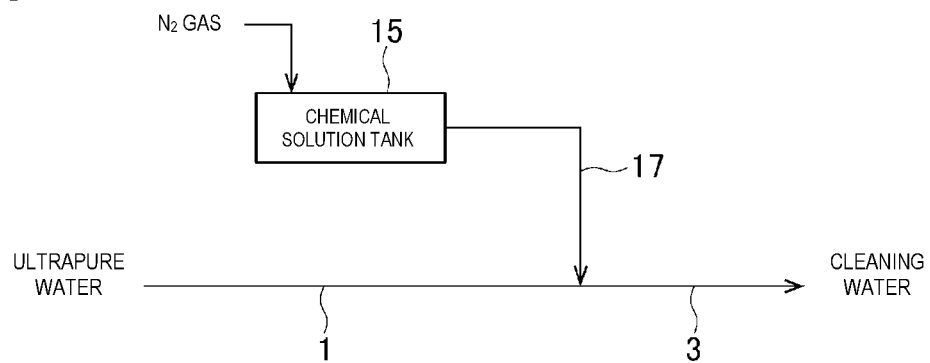
FIG. 5 is a configuration diagram of the cleaning water production unit.

In FIGS. 3 and 4, the chemical solution in the chemical solution tank 15 is injected into the ultrapure water line 1 by the chemical injection pump 16. However, the chemical solution may be added to the ultrapure water line 1 by a fixed amount by supplying a fixed amount of inert gas such as nitrogen gas to the chemical solution tank 15 as in FIG. 5. FIG. 5 relates to FIG. 3, but FIG. 4 may also be configured in a similar manner. Also in FIGS. 6 to 8 described below, the chemical solution in the chemical solution tank 15 is injected by the gas pressure of nitrogen gas and the like.

Figure 6:
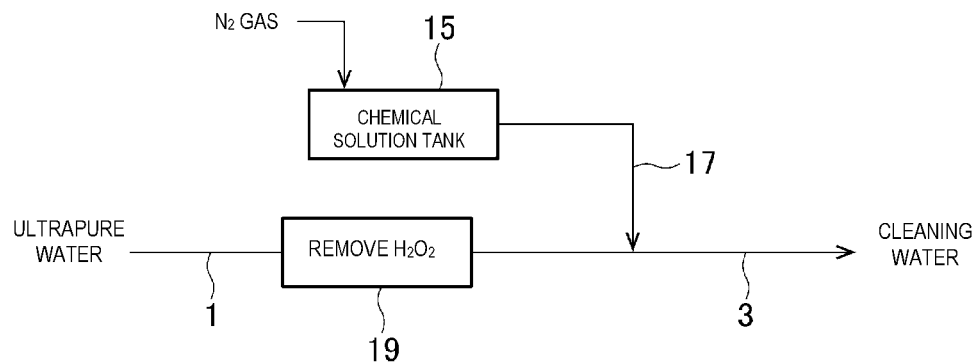
FIG. 6 is a configuration diagram of the cleaning water production unit.

The cleaning water production unit in FIG. 6 is obtained by providing a hydrogen peroxide removal device 19 in the ultrapure water line 1 in FIG. 5, and other configurations are the same as FIG. 5. By installing the hydrogen peroxide removal device 19, the amount of the oxidizing agent in the cleaning water can be accurately controlled. Note that, also in FIGS. 3 and 4, the hydrogen peroxide removal device 19 may be installed in the ultrapure water line 1.

Figure 7:
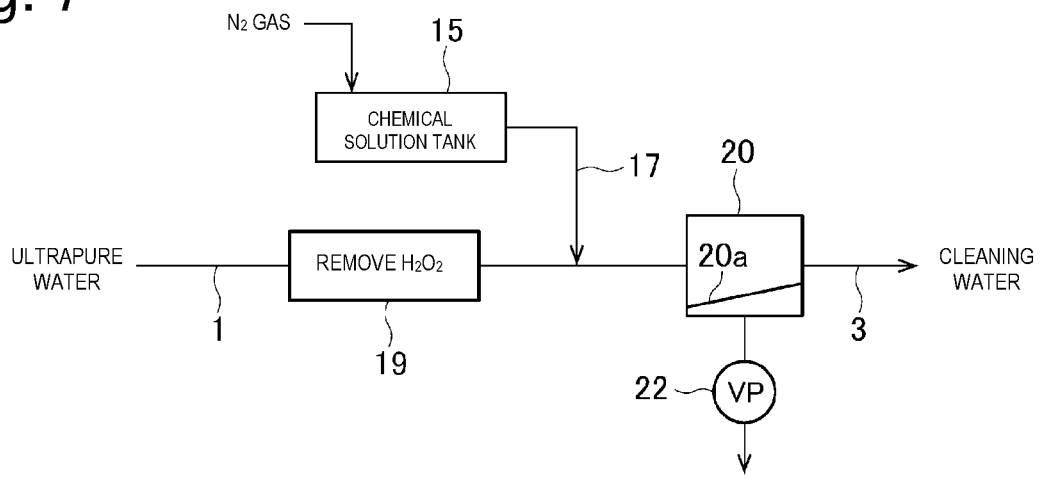
FIG. 7 is a configuration diagram of the cleaning water production unit.

In FIG. 7, the cleaning water production unit in FIG. 6 further includes a deaeration device 20 for removing gas components such as oxygen from the cleaning water. In this embodiment, the deaeration device 20 is a membrane-type deaeration device including a membrane 20a, and is formed so as to decompress the inside of a gas phase chamber separated by the membrane 20a by decompression means such as a vacuum pump 22. However, the deaeration device may be a device other than the membrane deaeration device. The deaeration device 20 may be provided as in FIG. 7 also in FIGS. 3 to 5.

Figure 8:
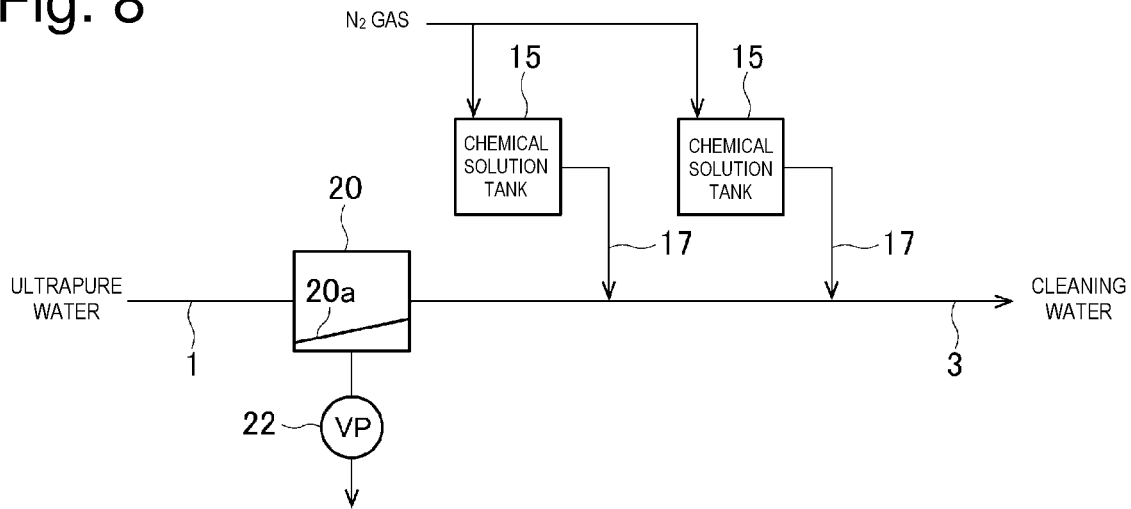
FIG. 8 is a configuration diagram of the cleaning water production unit.

As in FIG. 8, the deaeration device 20 may be installed in the ultrapure water line 1 on the upstream side with respect to the injection points.

In the present invention, the chemical solution injected in the ultrapure water is a chemical solution prepared by dissolving the pH adjuster and/or the oxidation-reduction potential adjuster in the ultrapure water. As the pH adjuster, hydrochloric acid, acetic acid, nitric acid, phosphoric acid, sulfuric acid, hydrofluoric acid, ammonia, sodium hydroxide, potassium hydroxide, tetramethylammonium hydroxide, ammonium carbonate, or the like can be used.

As the oxidation-reduction potential adjuster, hydrogen peroxide or nitric acid can be used.

The chemical solution used in the present invention generally contains those chemical agents at a concentration of from about 20 weight percent to about 48 weight percent, and cleaning water with a chemical agent concentration of from about 0.1 mg/L to about 100 mg/L is generally produced by injecting the chemical solution as above into the ultrapure water.

As described above, in the present invention, the related-art injection mechanism can be directly applied to the dissolution of acid, alkali, an oxidizing agent, a reducing agent, and the like in the production unit 2. In other words, by the pressure feeding by a pump or inert gas such as $N_2$, the solute is dissolved so as to obtain a desired solute concentration.

The solute concentration in the cleaning water sometimes deviates from a predetermined range immediately after the production of the cleaning water starts in the production unit 2. In this case, it is preferred that the time and the processing amount needed until the concentration becomes stable at the desired concentration be searched in advance, and the discharging from the drain piping 6 be performed until the state is reached.

As a result, the solute concentration of the dilute cleaning water supplied to the storage tank 4 can be accurately maintained. The discharged amount at this time becomes wastewater, but is little as a water amount of the whole.

The purity in the production unit system can be maintained to be high by causing the ultrapure water to continue to flow at an extremely low flow rate even when the water level in the storage tank 4 is a certain level or more and the production unit 2 is in a suspension state. Water from the flowing water outlet at this time is either discharged from the piping 6 or is caused to flow into the return piping for the ultrapure water.

Figure 2:
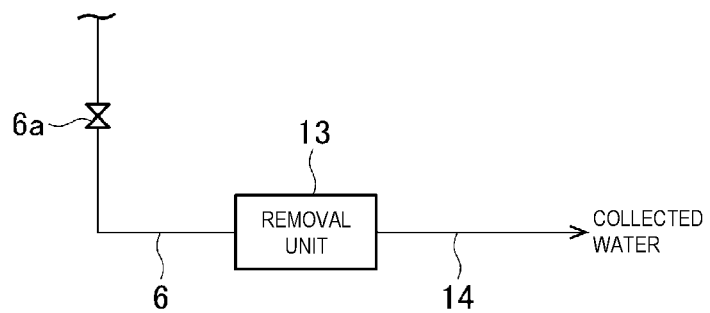
FIG. 2 is a system diagram illustrating another configuration of a part of FIG. 1.

The drain from the drain piping 6 is discharged in FIG. 1, but a solute removal unit 13 may be provided and the water obtained by removing the solute from the drain may be collected via the piping 14 as in FIG. 2.

It is possible to handle the removal of the solute in the removal unit 13 with only an ion exchange resin or a platinum group catalyst. In other words, acid and alkali in the order of ppm can be easily removed by an ion exchange device. An electric regeneration-type ion exchange device (so-called EDI) can be applied. Catalysts such as a platinum nano colloid supported resin are effective for the removal of the oxidizing agent and the reducing agent. When there is excess water containing a large amount of ozone, a catalyst suitable for ozone destruction is desired to be added.

The solute concentration in the drain is in the order of ppm, which is extremely low, and the type of the solute is limited. Therefore, it is easy to sufficiently remove the solute, and the purity returns to a purity close to the ultrapure water by a simple combination of an ion exchange device and a catalyst device. Therefore, the collected water of which solute is removed in the removal unit 13 can be guided to the return piping for excess ultrapure water and the ultrapure water tank, and reuse without waste is possible.

In the present invention, two stages (a high flow speed condition and a low flow speed condition) of flow rate conditions under which dilute cleaning water can be accurately produced at a desired concentration can be defined. The production flow rate condition can be switched from the high flow speed condition to the low flow speed condition when the water level in the storage tank 4 rises and reaches a predetermined level (for example, a level between the upper limit level and an intermediate level). The production flow rate condition can be switched from the low flow speed condition to the high flow speed condition when the water level decreases and reaches a predetermined level (for example, a level between the lower limit level and the intermediate level). In this case, there is no wastewater during the time necessary for the concentration stabilization when the production starts, and a system with less waste is obtained.

The embodiment described above is an example of the present invention, and the present invention may be a form other than those in the drawings. For example, it is possible to install only one cleaning machine.

The present invention has been described in detail with predetermined aspects, but it would be clear to a person skilled in the art that various changes can be made without departing from the intent and the scope of the present invention.

This application is based on Japanese Patent Application No. 2017-080627 filed on Apr. 14, 2017, the entirety of which is incorporated herein by reference.

REFERENCE SIGNS LIST

1 Ultrapure water line
2 Cleaning water production unit
4 Storage tank
5A to 5N Cleaning machine
15 Chemical solution tank
16 Chemical injection pump
20 Deaeration device

The invention claimed is:
1. A cleaning water supply device, comprising:
a cleaning water production unit that produces cleaning water at a certain concentration by adding a pH adjuster and/or an oxidation-reduction potential adjuster to ultrapure water;
a storage tank that stores the cleaning water from the cleaning water production unit therein; and
a plurality of supply means for supplying the cleaning water in the storage tank to cleaning machines, each supply means including a branching piping directly connected to the storage tank, a pump attached to the branching piping, a pipe connecting the branching piping to one of the cleaning machines through the pump, and a return piping extending from the pipe to the storage tank to return part of the cleaning water to the storage tank.

2. The cleaning water supply device according to claim 1, further comprising controlling means for controlling the cleaning water production unit so that a cleaning water level in the storage tank is in a predetermined range.

3. The cleaning water supply device according to claim 2, further comprising switching means for guiding the cleaning water from the cleaning water production unit to a discharge line when a water quality of the cleaning water from the cleaning water production unit is out of a specified range.

4. The cleaning water supply device according to claim 3, further comprising a removal unit for removing a solute from discharged water from the discharge line.

5. The cleaning water supply device according to claim 3, wherein the controlling means causes the ultrapure water to flow to the cleaning water production unit at a low flow rate while the cleaning water production unit is suspended.

6. The cleaning water supply device according to claim 2, wherein the controlling means sets two stages for a production flow rate of the cleaning water in the cleaning water production unit, switches the production flow rate from a high flow rate to a low flow rate when the water level in the storage tank becomes equal to or more than a first predetermined water level, and switches the production flow rate from the low flow rate to the high flow rate when the water level becomes equal to or less than a second predetermined water level.

7. The cleaning water supply device according to claim 1, wherein the cleaning water production unit comprises a chemical solution tank containing the pH adjuster and/or the oxidation-reduction potential adjuster, to which an inert gas is supplied to provide the pH adjuster and/or the oxidation-reduction potential adjuster to the ultrapure water.

8. The cleaning water supply device according to claim 7, further comprising a hydrogen peroxide removal device to remove hydrogen peroxide from the ultrapure water before providing the pH adjuster and/or the oxidation-reduction potential adjuster to the ultrapure water.

9. The cleaning water supply device according to claim 8, further comprising a deaeration device after providing the pH adjuster and/or the oxidation-reduction potential adjuster to the ultrapure water to remove gas from the ultrapure water.

10. The cleaning water supply device according to claim 7, further comprising an inert gas supplying piping attached to the storage tank for supplying an inert gas to purge oxygen in the storage tank, and a mechanism so that the inert gas is filled constantly in the storage tank.

* * * * *